United States Patent
Mukai et al.

(10) Patent No.: US 11,715,778 B2
(45) Date of Patent: Aug. 1, 2023

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Akira Mukai, Kawasaki (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 422 days.

(21) Appl. No.: 16/797,052

(22) Filed: Feb. 21, 2020

(65) Prior Publication Data
US 2021/0005730 A1 Jan. 7, 2021

(30) Foreign Application Priority Data
Jul. 4, 2019 (JP) .................................. 2019-125293

(51) Int. Cl.
*H01L 29/778* (2006.01)
*H01L 29/423* (2006.01)
(Continued)

(52) U.S. Cl.
CPC .... *H01L 29/42376* (2013.01); *H01L 29/2003* (2013.01); *H01L 29/205* (2013.01);
(Continued)

(58) Field of Classification Search
CPC .......................... H01L 29/7786; H01L 29/7787
See application file for complete search history.

(56) References Cited

U.S. PATENT DOCUMENTS

| 9,123,739 B2 | 9/2015 | Okamoto et al. |
| 2010/0025730 A1 | 2/2010 | Heikman et al. |

(Continued)

FOREIGN PATENT DOCUMENTS

| JP | 09-092828 A | 4/1997 |
| JP | 2008-210836 | * 11/2008 |

(Continued)

*Primary Examiner* — Grant S Withers
(74) *Attorney, Agent, or Firm* — Oblon, McClelland, Maier & Neustadt, L.L.P.

(57) ABSTRACT

According to one embodiment, a semiconductor device includes first, second, and third electrodes, and first, second, and third semiconductor regions. The third electrode is between the first electrode and the second electrodes. The first semiconductor region includes $Al_{x1}Ga_{1-x1}N$ and includes first to seventh partial regions. The fourth partial region is between the first partial region and the third partial region. The fifth partial region is between the third partial region and the second partial region. The second semiconductor region includes $Al_{x2}Ga_{1-x2}N$ and includes first and second semiconductor portions. The sixth partial region is between the fourth partial region and the first semiconductor portion. The seventh partial region is between the fifth partial region and the second semiconductor portion. The third semiconductor region includes $Al_{x3}Ga_{1-x3}N$ and includes a first semiconductor film part. The first semiconductor film part is between the sixth partial region and the third electrode.

19 Claims, 5 Drawing Sheets

(51) Int. Cl.
*H01L 29/20* (2006.01)
*H01L 29/205* (2006.01)

(52) U.S. Cl.
CPC .... *H01L 29/42364* (2013.01); *H01L 29/7786* (2013.01); *H01L 29/7787* (2013.01)

(56) References Cited

U.S. PATENT DOCUMENTS

2010/0117146 A1   5/2010   Ikeda et al.
2014/0084300 A1   3/2014   Okamoto et al.

FOREIGN PATENT DOCUMENTS

| JP | 2010-118556 A | 5/2010 |
| JP | 2011-124509 A | 6/2011 |
| JP | 2011-155116 A | 8/2011 |
| JP | 2015-149488 A | 8/2015 |
| JP | 2016-105499 A | 6/2016 |

* cited by examiner

SEMICONDUCTOR DEVICE

CROSS-REFERENCE TO RELATED APPLICATIONS

This application is based upon and claims the benefit of priority from Japanese Patent Application No. 2019-125293, filed on Jul. 4, 2019; the entire contents of which are incorporated herein by reference.

FIELD

Embodiments described herein relate generally to a semiconductor device.

BACKGROUND

For example, there is a semiconductor device such as a transistor or the like that uses a nitride semiconductor. It is desirable to improve the characteristics of the semiconductor device.

DETAILED DESCRIPTION

Figure 1A:
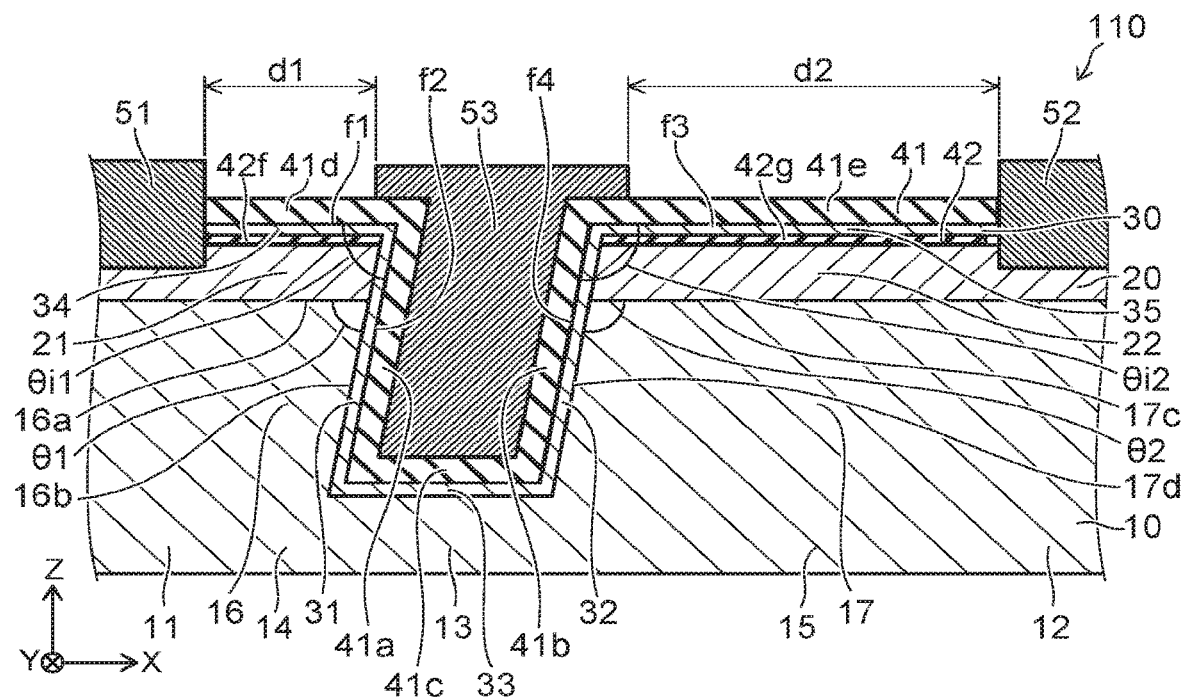
FIG. 1A and FIG. 1B are schematic cross-sectional views illustrating a semiconductor device according to a first embodiment.

According to one embodiment, a semiconductor device includes a first electrode, a second electrode, a third electrode, a first semiconductor region, a second semiconductor region, and a third semiconductor region. A position of the third electrode in a first direction is between a position of the first electrode in the first direction and a position of the second electrode in the first direction. The first direction is from the first electrode toward the second electrode. The first semiconductor region includes $Al_{x1}Ga_{1-x1}N$ ($0 \le x1 < 1$) and includes a first partial region, a second partial region, a third partial region, a fourth partial region, a fifth partial region, a sixth partial region, and a seventh partial region. A second direction is from the first partial region toward the first electrode and crosses the first direction. A direction from the second partial region toward the second electrode is aligned with the second direction. A direction from the third partial region toward the third electrode is aligned with the second direction. The fourth partial region is between the first partial region and the third partial region in the first direction. The fifth partial region is between the third partial region and the second partial region in the first direction. The second semiconductor region includes $Al_{x2}Ga_{1-x2}N$ ($0 < x2 < 1$ and $x1 < x2$) and includes a first semiconductor portion and a second semiconductor portion. A direction from the fourth partial region toward the first semiconductor portion is aligned with the second direction. A direction from the fifth partial region toward the second semiconductor portion is aligned with the second direction. The sixth partial region is between the fourth partial region and the first semiconductor portion in the second direction. The seventh partial region is between the fifth partial region and the second semiconductor portion in the second direction. The third semiconductor region includes $Al_{x3}Ga_{1-x3}N$ ($0 < x3 \le 1$ and $x1 < x3$) and includes a first semiconductor film part. The first semiconductor film part is between the sixth partial region and the third electrode in the first direction. The sixth partial region has a first surface and a second surface. The first surface opposes the first semiconductor portion. The second surface opposes the first semiconductor film part. A first angle between the first surface and at least a portion of the second surface is less than 90 degrees.

According to another embodiment, a semiconductor device includes a first electrode, a second electrode, a third electrode, a first semiconductor region, a second semiconductor region, and a third semiconductor region. A position of the third electrode in a first direction is between a position of the first electrode in the first direction and a position of the second electrode in the first direction. The first direction is from the first electrode toward the second electrode. The first semiconductor region includes $Al_{x1}Ga_{1-x1}N$ ($0 \le x1 < 1$) and includes a first partial region, a second partial region, a third partial region, a fourth partial region, a fifth partial region, a sixth partial region, and a seventh partial region. A second direction is from the first partial region toward the first electrode and crosses the first direction. A direction from the second partial region toward the second electrode is aligned with the second direction. A direction from the third partial region toward the third electrode is aligned with the second direction. The fourth partial region is between the first partial region and the third partial region in the first direction. The fifth partial region is between the third partial region and the second partial region in the first direction. The second semiconductor region includes $Al_{x2}Ga_{1-x2}N$ ($0 < x2 < 1$ and $x1 < x2$) and includes a first semiconductor portion and a second semiconductor portion. A direction from the fourth partial region toward the first semiconductor portion is aligned with the second direction. A direction from the fifth partial region toward the second semiconductor portion is aligned with the second direction. The sixth partial region is between the fourth partial region and the first semiconductor portion in the second direction. The seventh partial region is between the fifth partial region and the second semiconductor portion in the second direction. The third semiconductor region includes $Al_{x3}Ga_{1-x3}N$ ($0 < x3 \le 1$ and $x1 < x3$) and includes a first semiconductor film part. The first semiconductor film part is between the sixth partial region and the third electrode in the first direction. The first insulating member includes a first insulating portion, a second insulating portion, a third insulating portion, and a fourth insulating portion. The first insulating portion is between the sixth partial region and the third electrode. The second insulating portion is between the third electrode and the seventh partial region. The third insulating portion is between the third partial region and the third electrode. The first semiconductor portion is between the sixth partial region and the fourth insulating portion. The fourth insulating portion has a first insulating portion surface opposing the first semiconductor portion. The first insulating portion has a second insulating portion surface opposing the first semiconductor film part. An insulating member surface angle between the first insulating portion surface and at least a portion of the second insulating portion surface is less than 90 degrees.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
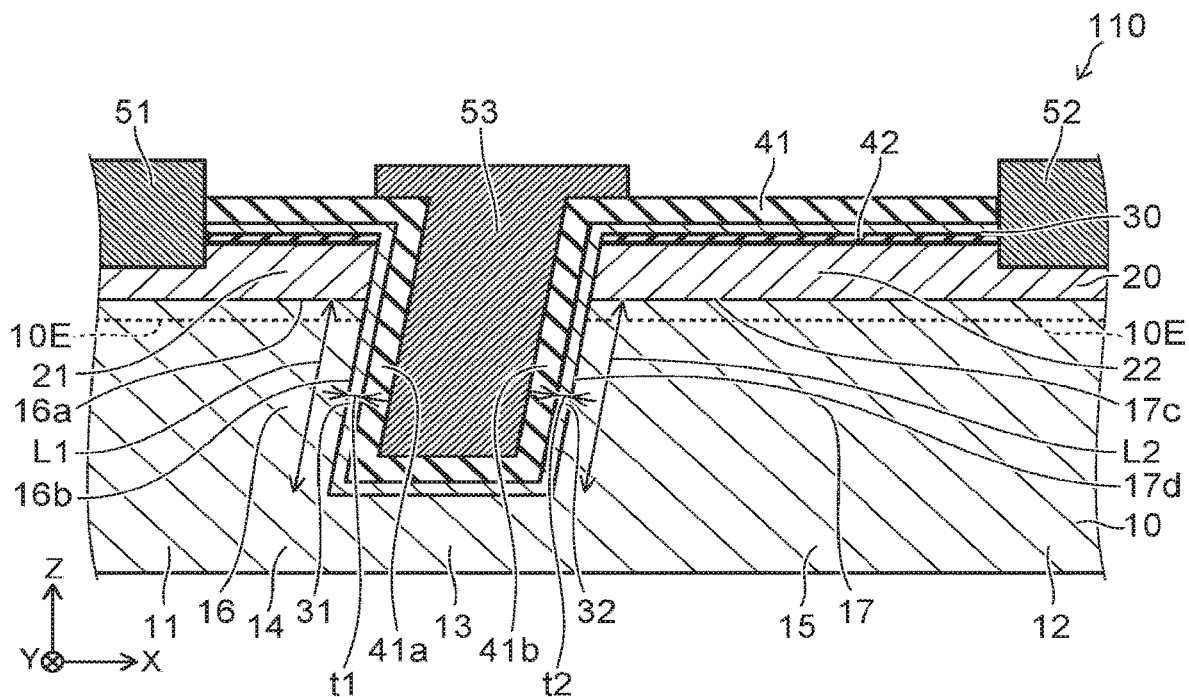

FIG. 1A and FIG. 1B are schematic cross-sectional views illustrating a semiconductor device according to a first embodiment.

As shown in FIG. 1A, the semiconductor device 110 according to the embodiment includes a first electrode 51, a second electrode 52, a third electrode 53, a first semiconductor region 10, a second semiconductor region 20, and a third semiconductor region 30. In the example, the semiconductor device 110 further includes a first insulating member 41 and a second insulating member 42.

A first direction from the first electrode 51 toward the second electrode 52 is taken as an X-axis direction. One direction perpendicular to the X-axis direction is taken as a Z-axis direction. A direction perpendicular to the X-axis direction and the Z-axis direction is taken as a Y-axis direction.

The position of the third electrode 53 in the first direction (the X-axis direction) is between the position of the first electrode 51 in the first direction and the position of the second electrode 52 in the first direction. For example, at least a portion of the third electrode 53 may be between the first electrode 51 and the second electrode 52 in the X-axis direction.

The first semiconductor region 10 includes $Al_{x1}Ga_{1-x1}N$ (0≤x1<1). The first semiconductor region 10 includes, for example, a nitride semiconductor. For example, the first semiconductor region 10 spreads substantially parallel to the X-Y plane.

The first semiconductor region 10 includes a first partial region 11, a second partial region 12, a third partial region 13, a fourth partial region 14, a fifth partial region 15, a sixth partial region 16, and a seventh partial region 17.

A second direction from the first partial region 11 toward the first electrode 51 crosses the first direction (the X-axis direction). The second direction is, for example, the Z-axis direction. Hereinbelow, the second direction is taken as the Z-axis direction.

The direction from the second partial region 12 toward the second electrode 52 is aligned with the second direction. The direction from the third partial region 13 toward the third electrode 53 is aligned with the second direction. The fourth partial region 14 is between the first partial region 11 and the third partial region 13 in the first direction (the X-axis direction). The fifth partial region 15 is between the third partial region 13 and the second partial region 12 in the first direction (the X-axis direction). The sixth partial region 16 and the seventh partial region 17 are described below.

The second semiconductor region 20 includes $Al_{x2}Ga_{1-x2}N$ (0<x2<1 and x1<x2). The second semiconductor region 20 includes, for example, AlGaN. The composition ratio x2 is, for example, greater than 0 and not more than 0.5. The composition ratio x2 may be, for example, not less than 0.15 and not more than 0.25. The second semiconductor region 20 includes, for example, a nitride semiconductor.

The second semiconductor region 20 includes a first semiconductor portion 21 and a second semiconductor portion 22. The direction from the fourth partial region 14 toward the first semiconductor portion 21 is aligned with the second direction (e.g., the Z-axis direction). The direction from the fifth partial region 15 toward the second semiconductor portion 22 is aligned with the second direction. The sixth partial region 16 is between the fourth partial region 14 and the first semiconductor portion 21 in the second direction. The seventh partial region 17 is between the fifth partial region 15 and the second semiconductor portion 22 in the second direction.

The third semiconductor region 30 includes $Al_{x3}Ga_{1-x3}N$ (0<x3≤1 and x1<x3). The third semiconductor region 30 includes, for example, AlGaN or AlN. The composition ratio x3 of Al in the third semiconductor region 30 is, for example, greater than 0.5 and not more than 1. The composition ratio x3 of Al may be, for example, not less than 0.8 and not more than 1. The third semiconductor region 30 includes, for example, a nitride semiconductor. In one example, the composition ratio x3 is higher than the composition ratio x2.

The third semiconductor region 30 includes a first semiconductor film part 31. The first semiconductor film part 31 is between the sixth partial region 16 and the third electrode 53 in the first direction (the X-axis direction).

In the example, the third semiconductor region 30 further includes a second semiconductor film part 32. The second semiconductor film part 32 is between the third electrode 53 and the seventh partial region 17 in the first direction (the X-axis direction). In the example, the third semiconductor region 30 further includes a third semiconductor film part 33. The third semiconductor film part 33 is between the third partial region 13 and the third electrode 53 in the second direction (e.g., the Z-axis direction). The second semiconductor film part 32 and the third semiconductor film part 33 may be omitted from the embodiment. The first insulating member 41 includes a first insulating portion 41a, a second insulating portion 41b, and a third insulating portion 41c. The first insulating portion 41a is between the sixth partial region 16 and the third electrode 53. For example, the first insulating portion 41a is between the first semiconductor film part 31 and the third electrode 53. The second insulating portion 41b is between the third electrode 53 and the seventh partial region 17. For example, the second insulating portion 41b is between the third electrode 53 and the second semiconductor film part 32. The third insulating portion 41c is between the third partial region 13 and the third electrode 53. For example, the third insulating portion 41c is between the third semiconductor film part 33 and the third electrode 53.

For example, the first electrode 51 is electrically connected to the first semiconductor portion 21. For example, the second electrode 52 is electrically connected to the second semiconductor portion 22.

For example, the first electrode 51 functions as a source electrode. For example, the second electrode 52 functions as a drain electrode. For example, the third electrode 53 functions as a gate electrode. For example, the first insulating member 41 functions as a gate insulating film. The semiconductor device 110 is, for example, a MOS power device.

As shown in FIG. 1B, for example, a carrier region 10E is formed in a portion of the first semiconductor region 10 opposing the second semiconductor region 20. The carrier region 10E is, for example, a two-dimensional electron gas. The semiconductor device 110 is, for example, a HEMT (High Electron Mobility Transistor). For example, the current that flows in a current path between the first electrode 51 and the second electrode 52 can be controlled by the voltage applied to the third electrode 53.

In the embodiment, at least a portion of the side surface of a hole (e.g., a trench) in which the first semiconductor film part 31 is provided has a reverse-tapered configuration.

As shown in FIG. 1A, for example, the sixth partial region 16 has a first surface 16a and a second surface 16b. The first surface 16a opposes the first semiconductor portion 21. The second surface 16b opposes the first semiconductor film part 31. The angle between the first surface 16a and at least a portion of the second surface 16b is taken as a first angle $\theta 1$. In the embodiment, the first angle $\theta 1$ is less than 90 degrees. For example, the first angle $\theta 1$ is less than 89.4 degrees. In the embodiment, the first angle $\theta 1$ may be 80 degrees or more.

For example, the orientation from the first semiconductor region 10 toward the second semiconductor region 20 is aligned with the +c axis direction of the nitride semiconductor. Thereby, the carrier region 10E is formed in the portion of the first semiconductor region 10 opposing the second semiconductor region 20. For example, the carrier region 10E is formed at the vicinity of the upper surface of the sixth partial region 16 and the vicinity of the upper surface of the seventh partial region 17 (referring to FIG. 1B).

On the other hand, polarization that has the reverse orientation of that of the +c axis direction occurs in the portion of the sixth partial region 16 opposing the first semiconductor film part 31. Therefore, a charge that has the reverse polarity of the polarity of the carrier region 10E is generated in the portion of the sixth partial region 16 opposing the first semiconductor film part 31. A current does not flow easily in the portion of the sixth partial region 16 opposing the first semiconductor film part 31.

For example, a high threshold voltage is obtained thereby. For example, a normally-off characteristic can be obtained easily and stably. According to the embodiment, a semiconductor device can be provided in which the characteristics can be improved.

In the embodiment, it is favorable for the composition ratio x3 to be higher than the composition ratio x2. Thereby, the charge that has the reverse polarity can be generated more easily; and the threshold voltage can be increased more effectively.

In the embodiment, a current does not flow easily in a portion of the current path between the first electrode 51 and the second electrode 52. In the example, a current does not flow easily in the current path at the first electrode 51 side because the first angle $\theta 1$ at the first electrode 51 side (the source electrode side) is less than 90 degrees (a reverse-tapered configuration). A high threshold voltage is obtained because the current does not flow easily in a portion of the current path; therefore, for example, the tilt at the second electrode 52 side may be a forward taper.

For example, as shown in FIG. 1A, the third semiconductor region 30 includes the second semiconductor film part 32. As described above, the second semiconductor film part 32 is between the third electrode 53 and the seventh partial region 17 in the first direction (the X-axis direction). The seventh partial region 17 has a third surface 17c and a fourth surface 17d. The third surface 17c opposes the second semiconductor portion 22. The fourth surface 17d opposes the second semiconductor film part 32. The angle between the third surface 17c and at least a portion of the fourth surface 17d is taken as a second angle $\theta 2$. In the example, the second angle $\theta 2$ is greater than 90 degrees.

For example, the second surface 16b and the fourth surface 17d may be substantially parallel to each other. For example, the angle between a plane including the at least a portion of the second surface 16b recited above and a plane including the at least a portion of the fourth surface 17d recited above is 5 degrees or less.

Such a second surface 16b and such a fourth surface 17d can be formed as follows. For example, etching is performed in an oblique direction when forming the hole (the trench) in the semiconductor stacked body used to form the first semiconductor region 10 and the second semiconductor region 20. For example, a side surface that has a reverse taper can be formed by performing RIE (Reactive Ion Etching), etc., in a state in which the front surface of the semiconductor stacked body is oblique. The second surface 16b and the fourth surface 17d such as those recited above are obtained by forming a film used to form the third semiconductor region 30 on the side surface. Also, the first insulating member 41 and the third electrode 53 of the semiconductor device 110 can be formed by forming an insulating film and a conductive member used to form the third electrode 53 in the hole.

In the embodiment, for at least one of the first electrode 51 side or the second electrode 52 side, the semiconductor portion that opposes the third electrode 53 in the X-axis direction has a reverse-tapered configuration. A high threshold voltage is obtained thereby. An example of the threshold voltage is described below.

In the example, the first insulating member 41 includes a fourth insulating portion 41d and a fifth insulating portion 41e. The first semiconductor portion 21 is between the sixth partial region 16 and the fourth insulating portion 41d in the Z-axis direction. The second semiconductor portion 22 is between the seventh partial region 17 and the fifth insulating portion 41e in the Z-axis direction.

In the example, the third semiconductor region 30 includes a fourth semiconductor film part 34 and a fifth semiconductor film part 35. The fourth semiconductor film part 34 is between the first semiconductor portion 21 and the fourth insulating portion 41d in the Z-axis direction. The fifth semiconductor film part 35 is between the second semiconductor portion 22 and the fifth insulating portion 41e in the Z-axis direction.

As shown in FIG. 1A, the second insulating member 42 is provided in the example. The second insulating member 42 includes a sixth insulating portion 42f and a seventh insulating portion 42g. The sixth insulating portion 42f is between the first semiconductor portion 21 and the fourth insulating portion 41d in the Z-axis direction. The sixth insulating portion 42f is between the first semiconductor portion 21 and the fourth semiconductor film part 34 in the Z-axis direction. The seventh insulating portion 42g is between the second semiconductor portion 22 and the fifth insulating portion 41e in the Z-axis direction. The seventh insulating portion 42g is between the second semiconductor portion 22 and the fifth semiconductor film part 35 in the Z-axis direction.

For example, the material of the first insulating portion 41a, the second insulating portion 41b, and the third insulating portion 41c may be the same as the material of the fourth insulating portion 41d and the fifth insulating portion 41e. The second insulating member 42 functions as a protective layer of the second semiconductor region 20.

For example, the first insulating member 41 includes oxygen and silicon. For example, the second insulating member 42 includes nitrogen and silicon. For example, the concentration of oxygen in the first insulating member 41 is higher than the concentration of oxygen in the second insulating member 42. For example, the concentration of nitrogen in the second insulating member 42 is higher than the concentration of nitrogen in the first insulating member 41. For example, the first insulating member 41 includes silicon oxide. For example, the second insulating member 42 includes silicon nitride.

As shown in FIG. 1A, a distance d1 between the first electrode 51 and the third electrode 53 is shorter than a distance d2 between the third electrode 53 and the second electrode 52. These distances are lengths along the X-axis direction. Thus, the distance d1 between the third electrode 53 and the first electrode 51 functioning as the source electrode is shorter than the distance d2 between the third electrode 53 and the second electrode 52 functioning as the drain electrode. For example, the appropriate breakdown voltage is obtained easily.

As described above, the first insulating member 41 may include the fourth insulating portion 41d. The first semiconductor portion 21 is between the sixth partial region 16 and the fourth insulating portion 41d in the Z-axis direction. The fourth insulating portion 41d has a first insulating portion surface f1. The first insulating portion surface f1 opposes the first semiconductor portion 21 in the Z-axis direction. In the example, the first insulating portion surface f1 opposes the first semiconductor portion 21 with the fourth semiconductor film part 34 and the sixth insulating portion 42f interposed. On the other hand, the first insulating portion 41a has a second insulating portion surface f2. The second insulating portion surface f2 opposes the first semiconductor film part 31 in the X-axis direction.

The angle between the first insulating portion surface f1 and at least a portion of the second insulating portion surface f2 is taken as a first insulating member surface angle θi1. In the embodiment, the first insulating member surface angle θi1 is less than 90 degrees. For example, the first angle θ1 easily can be less than 90 degrees because the first insulating member surface angle θi1 is less than 90 degrees.

For example, the first surface 16a is along the first insulating portion surface f1. The second surface 16b is along the second insulating portion surface f2. The first angle θ1 is set to be less than 90 degrees by setting the first insulating member surface angle θi1 to be less than 90 degrees. For example, a high threshold voltage is obtained easily thereby.

As described above, the first insulating member 41 may include the fifth insulating portion 41e. The second semiconductor portion 22 is between the seventh partial region 17 and the fifth insulating portion 41e in the Z-axis direction.

The fifth insulating portion 41e has a third insulating portion surface f3. The third insulating portion surface f3 opposes the second semiconductor portion 22 in the Z-axis direction. In the example, the third insulating portion surface f3 opposes the second semiconductor portion 22 with the fifth semiconductor film part 35 and the seventh insulating portion 42g interposed. On the other hand, the second insulating portion 41b has a fourth insulating portion surface f4. The fourth insulating portion surface f4 opposes the second semiconductor film part 32 in the X-axis direction.

The angle between the third insulating portion surface f3 and at least a portion of the fourth insulating portion surface f4 is taken as a second insulating member surface angle θi2. In the example, the second insulating member surface angle θi2 is greater than 90 degrees. For example, the third surface 17c is along the third insulating portion surface f3. The fourth surface 17d is along the fourth insulating portion surface f4. For example, the second insulating member surface angle θi2 may be substantially parallel to the fourth surface 17d. As described below, the second insulating member surface angle θi2 may be less than 90 degrees.

Figure 2:
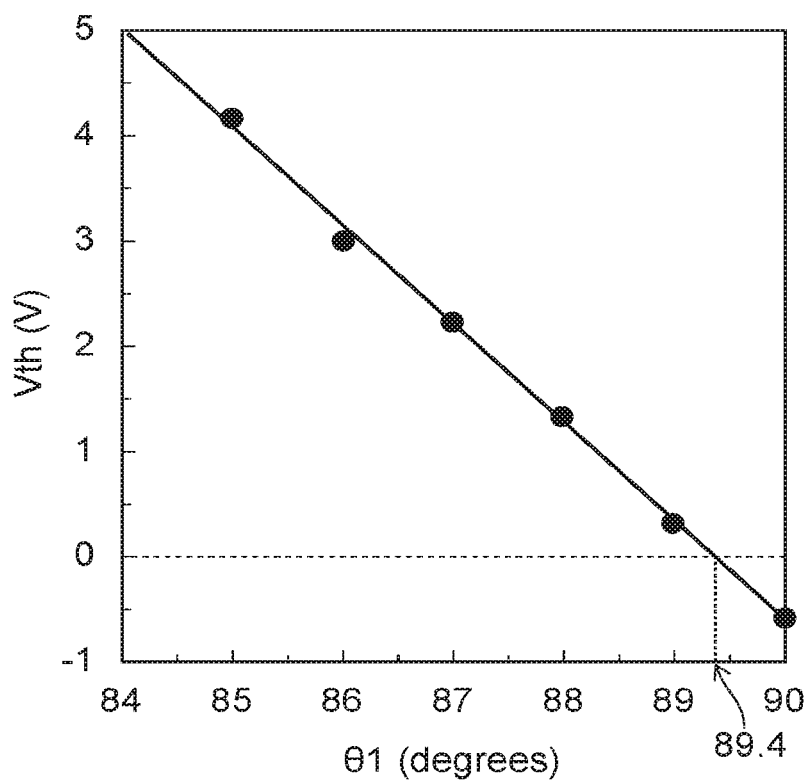
FIG. 2 is a graph illustrating a characteristic of the semiconductor device according to the first embodiment.

FIG. 2 is a graph illustrating a characteristic of the semiconductor device according to the first embodiment.

FIG. 2 illustrates simulation results of the threshold voltage of the semiconductor device according to the embodiment. The horizontal axis of FIG. 2 is the first angle θ1. The vertical axis of FIG. 2 is a threshold voltage Vth (V). In the example, the second angle θ2 is (180 degrees−the first angle θ1).

As shown in FIG. 2, the threshold voltage Vth increases as the first angle θ1 decreases. The threshold voltage Vth is negative when the first angle θ1 is 90 degrees. For example, the threshold voltage Vth becomes positive when the first angle θ1 is less than 89.4 degrees.

The threshold voltage Vth becomes excessively large when the first angle θ1 is excessively small. For example, it is favorable for the first angle θ1 to be 80 degrees or more. The first angle θ1 may be, for example, 85 degrees or more.

Thus, the threshold voltage Vth that is obtained when the first angle θ1 is less than 90 degrees is higher than when the first angle θ1 is 90 degrees. For example, a positive threshold voltage Vth is obtained by setting the first angle θ1 to be 89.4 degrees or less. Considering the fluctuation of the manufacturing processes, etc., practically, the first angle θ1 may be, for example, 89 degrees or less. The first angle θ1 may be, for example, 88 degrees or less.

As shown in FIG. 1B, the plane that includes the first direction and the second direction corresponds to the Z-X plane. It is favorable for a length L1 of the second surface 16b when cut by the Z-X plane to be not less than 50 nm and not more than 400 nm. For example, a high threshold voltage Vth is obtained stably by setting the length L1 to be not less than 50 nm. For example, an excessive increase of the resistance can be suppressed by setting the length L1 to be not more than 400 nm.

For example, a length L2 of the fourth surface 17d when cut by the Z-X plane may be not less than 50 nm and not more than 400 nm.

As shown in FIG. 1B, the thickness of the first semiconductor film part 31 along a direction perpendicular to the second surface 16b is taken as a thickness t1. It is favorable for the thickness t1 to be, for example, not less than 3 nm and not more than 8 nm. A uniform first semiconductor film part 31 is obtained easily by setting the thickness t1 to be not less than 3 nm. For example, the first semiconductor film part 31 has good crystallinity by setting the thickness t1 to be not more than 8 nm. Thereby, for example, the formation of traps is suppressed; and the characteristics are improved easily.

As shown in FIG. 1B, the thickness of the second semiconductor film part 32 along a direction perpendicular to the fourth surface 17d is taken as a thickness t2. It is favorable for the thickness t2 to be, for example, not less than 3 nm and not more than 8 nm.

Second Embodiment

Figure 3A:
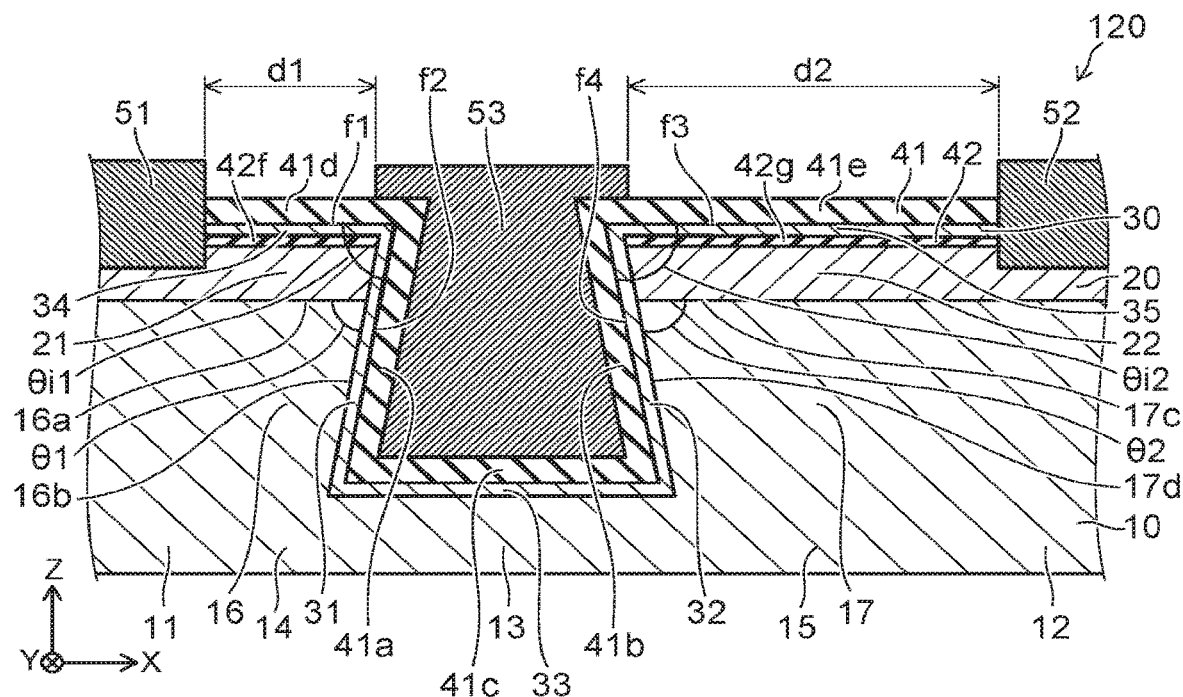
FIG. 3A and FIG. 3B are schematic cross-sectional views illustrating a semiconductor device according to a second embodiment.
Figure 3B:
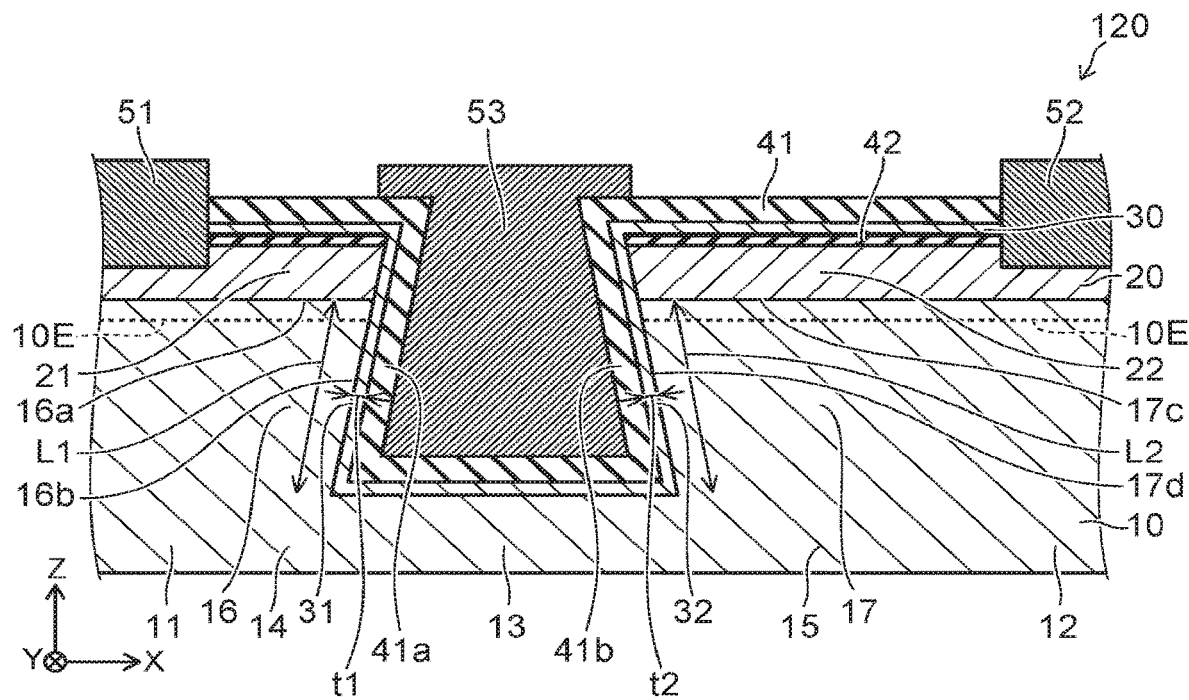

FIG. 3A and FIG. 3B are schematic cross-sectional views illustrating a semiconductor device according to a second embodiment.

As shown in FIG. 3A, the semiconductor device 120 according to the embodiment also includes the first electrode 51, the second electrode 52, the third electrode 53, the first semiconductor region 10, the second semiconductor region 20, the third semiconductor region 30, the first insulating member 41, and the second insulating member 42. In the semiconductor device 120 as well, the first angle θ1 is less than 90 degrees; and the first insulating member surface angle θi1 is less than 90 degrees. In the semiconductor device 120, the second angle θ2 also is less than 90 degrees; and the second insulating member surface angle θi2 also is less than 90 degrees. Otherwise, the configuration of the semiconductor device 120 is similar to the configuration of the semiconductor device 110.

In the semiconductor device 120 as well, a high threshold voltage is obtained. In the semiconductor device 120, the threshold voltage Vth can be increased more reliably and more stably by providing the side surface with a reverse taper for both the first electrode 51 side and the second electrode 52 side.

The configuration described in reference to the semiconductor device 110 is applicable to the semiconductor device 120. In the second embodiment as well, a semiconductor device can be provided in which the characteristics can be improved.

For example, the second surface 16b and the fourth surface 17d such as those illustrated in FIG. 3A can be formed by performing multiple etching along oblique directions having mutually-reversed components when forming the hole (the trench) in the semiconductor stacked body used to form the first semiconductor region 10 and the second semiconductor region 20.

Figure 4:
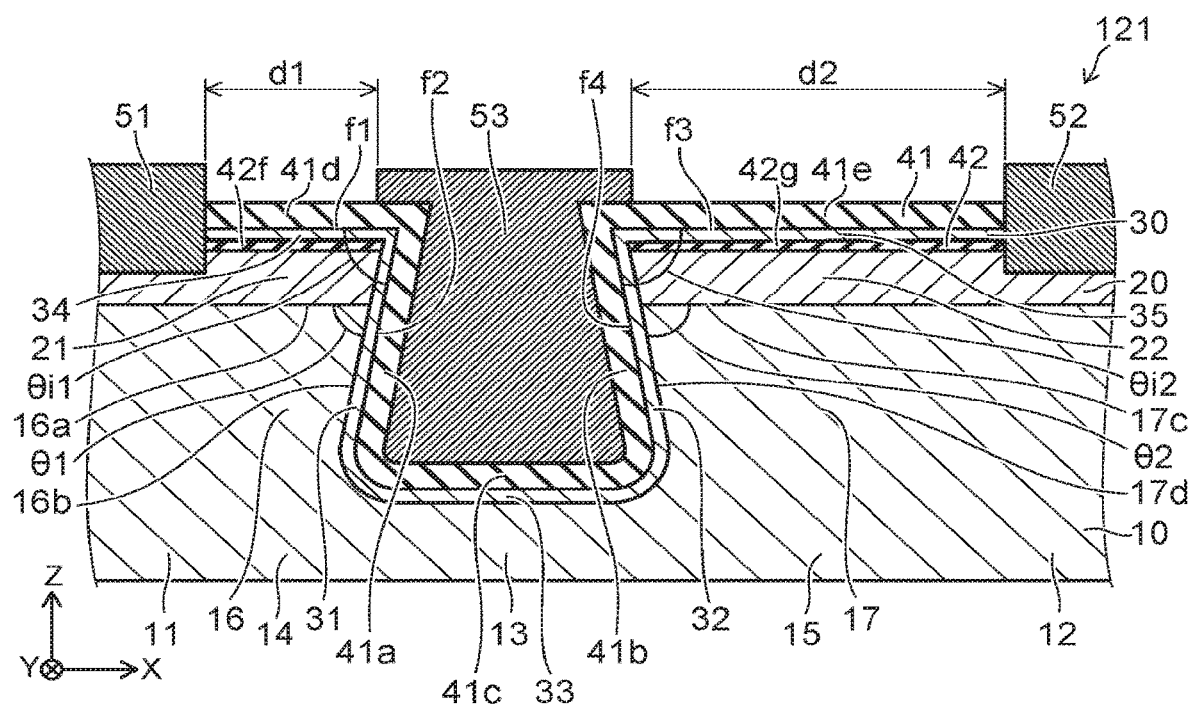
FIG. 4 is a schematic cross-sectional view illustrating a semiconductor device according to the second embodiment.

FIG. 4 is a schematic cross-sectional view illustrating a semiconductor device according to the second embodiment.

As shown in FIG. 4, in the semiconductor device 121 according to the embodiment as well, the first angle θ1, the first insulating member surface angle θi1, the second angle θ2, and the second insulating member surface angle θi2 each are less than 90 degrees. In the semiconductor device 121, the corner between the third semiconductor film part 33 and the first semiconductor film part 31 and the corner between the third semiconductor film part 33 and the second semiconductor film part 32 have curved configurations. The configurations of the corner between the third insulating portion 41c and the first insulating portion 41a and the corner between the third insulating portion 41c and the second insulating portion 41b are curved along the configuration of the semiconductor film part. The configuration of the lower end portion of the third electrode 53 also is curved along the configuration of the semiconductor film part. Otherwise, the configuration of the semiconductor device 121 is similar to the configuration of the semiconductor device 120.

In the semiconductor device 121 as well, a high threshold voltage is obtained. The configurations described in reference to the semiconductor devices 110 and 120 are applicable to the semiconductor device 121.

Third Embodiment

Figure 5A:
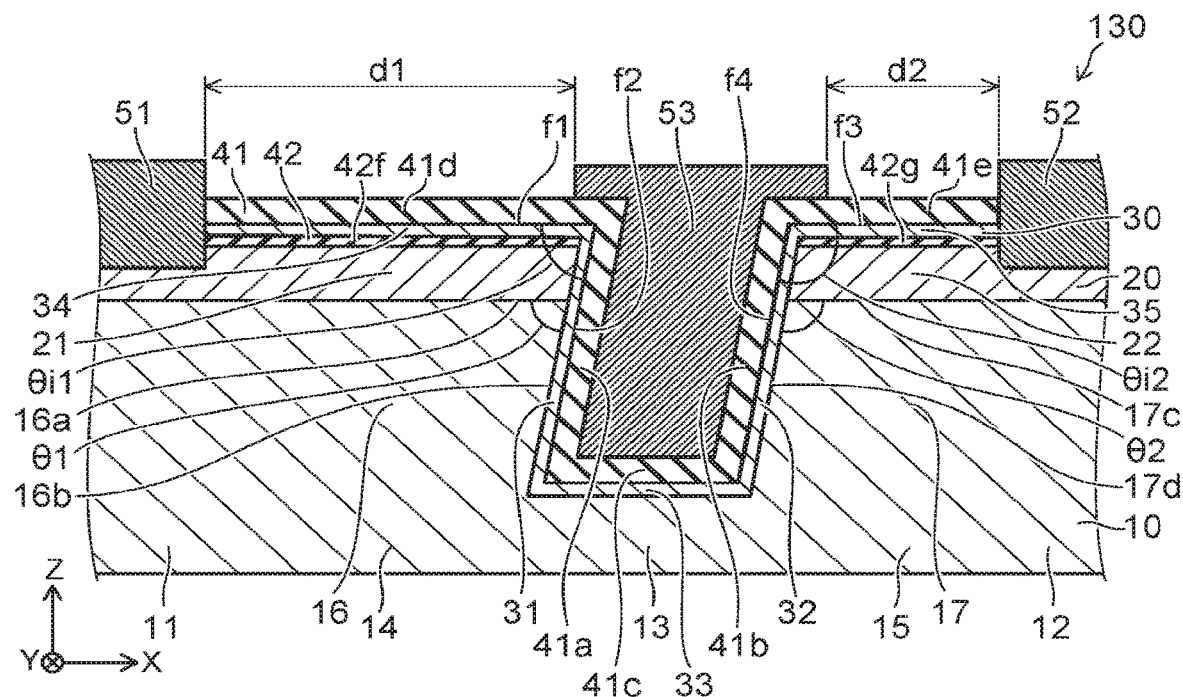
FIG. 5A and FIG. 5B are schematic cross-sectional views illustrating a semiconductor device according to a third embodiment.
Figure 5B:
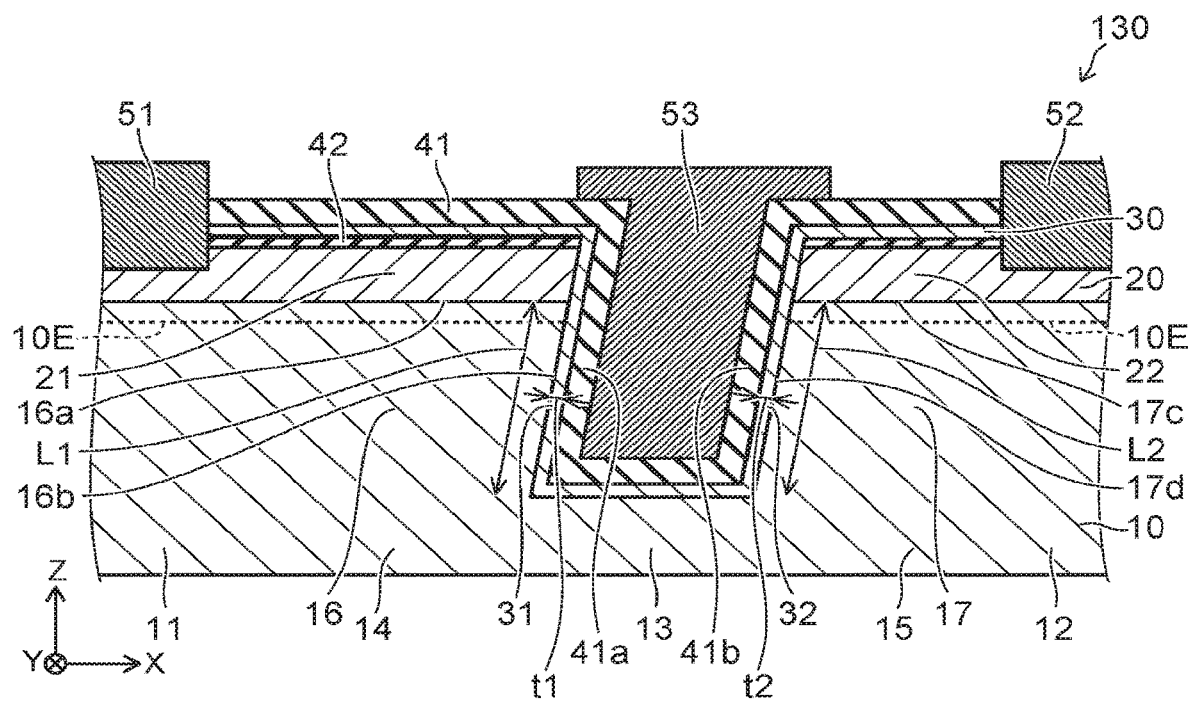

FIG. 5A and FIG. 5B are schematic cross-sectional views illustrating a semiconductor device according to a third embodiment.

As shown in FIG. 5A, the semiconductor device 130 according to the embodiment also includes the first electrode 51, the second electrode 52, the third electrode 53, the first semiconductor region 10, the second semiconductor region 20, the third semiconductor region 30, the first insulating member 41, and the second insulating member 42. In the semiconductor device 130 as well, the first angle θ1 is less than 90 degrees; and the first insulating member surface angle θi1 is less than 90 degrees. On the other hand, the second angle θ2 is greater than 90 degrees; and the second insulating member surface angle θi2 is greater than 90 degrees. In the semiconductor device 130, the distance d1 between the first electrode 51 and the third electrode 53 is longer than the distance d2 between the third electrode 53 and the second electrode 52. In such a case, for example, the first electrode 51 functions as a drain electrode; the second electrode 52 functions as a source electrode; and the third electrode 53 functions as a gate electrode.

In the semiconductor device 130 as well, the first angle θ1 is less than 90 degrees. For example, a high threshold voltage Vth is obtained easily. The first insulating member surface angle θi1 is less than 90 degrees. A high threshold voltage Vth is obtained easily thereby. In the third embodiment as well, a semiconductor device can be provided in which the characteristics can be improved.

In the semiconductor device 110 according to the first embodiment, a high threshold voltage is obtained more easily even when a high voltage is applied to the second electrode 52. On the other hand, in the semiconductor device 130 according to the third embodiment, for example, the effects of the first angle θ1 weaken when the high voltage is applied to the second electrode 52. Thereby, for example, a large process margin is obtained.

In the first to third embodiments, the upper surface of the third partial region 13 may be oblique to the X-Y plane.

In the first to third embodiments, the first electrode 51 and the second electrode 52 include, for example, at least one selected from the group consisting of Al and Ti. The third electrode 53 includes, for example, at least one selected from the group consisting of titanium nitride and Si.

In the first to third embodiments, the +c axis may not be exactly parallel to the Z-axis direction. For example, the angle between the +c axis and the Z-axis direction may be 5 degrees or less. For example, the angle between the −c axis and the Z-axis direction may be 5 degrees or less.

According to the embodiments, a semiconductor device can be provided in which the characteristics can be improved.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode;
a third electrode, a position of the third electrode in a first direction being between a position of the first electrode in the first direction and a position of the second electrode in the first direction, the first direction being from the first electrode toward the second electrode;
a first semiconductor region including $Al_{x1}Ga_{1-x1}N$ ($0 \le x1 < 1$) and including a first partial region, a second partial region, a third partial region, a fourth partial region, a fifth partial region, a sixth partial region, and a seventh partial region, a second direction being from the first partial region toward the first electrode and crossing the first direction, a direction from the second partial region toward the second electrode being aligned with the second direction, a direction from the third partial region toward the third electrode being aligned with the second direction, the fourth partial region being between the first partial region and the third partial region in the first direction, the fifth partial region being between the third partial region and the second partial region in the first direction;
a second semiconductor region including $Al_{x2}Ga_{1-x2}N$ ($0 < x2 < 1$ and $x1 < x2$) and including a first semiconductor portion and a second semiconductor portion, a direction from the fourth partial region toward the first semiconductor portion being aligned with the second direction, a direction from the fifth partial region toward the second semiconductor portion being aligned with the second direction, the sixth partial region being between the fourth partial region and the first semiconductor portion in the second direction, the seventh partial region being between the fifth partial region and the second semiconductor portion in the second direction;
a third semiconductor region including $Al_{x3}Ga_{1-x3}N$ ($0 < x3 \le 1$ and $x1 < x3$) and including a first semiconductor film part, a second semiconductor film part, a third semiconductor film part, and a fourth semiconductor film part, the first semiconductor film part being between the sixth partial region and the third electrode in the first direction, the second semiconductor film part being between the third electrode and the seventh partial region in the first direction, the third semiconductor film part being between the third partial region and the third electrode;
a first insulating member; and
a second insulating member, wherein
the first insulating member includes a first insulating portion, a second insulating portion, a third insulating portion, and a fourth insulating portion,
the first insulating portion is between the sixth partial region and the third electrode,
the second insulating portion is between the third electrode and the seventh partial region,
the third insulating portion is between the third partial region and the third electrode,
the first semiconductor portion is between the sixth partial region and the fourth insulating portion in the second direction,
the fourth semiconductor film part is between the first semiconductor portion and the fourth insulating portion in the second direction,
the first insulating member includes oxygen and silicon,
the second insulating member includes nitrogen and silicon,
the second insulating member includes a sixth insulating portion,
the sixth insulating portion is between the first semiconductor portion and the fourth semiconductor film part in the second direction,
the sixth insulating portion, the fourth semiconductor film part, and the fourth insulating portion are provided between the first electrode and the third electrode in the first direction,
the first electrode physically contacts the first semiconductor portion,
the fourth semiconductor film part includes a first face facing the fourth insulating portion,
the first semiconductor film part includes a second face facing the first insulating portion, and
a first angle between the first face and the second face is less than 90 degrees.

2. The device according to claim 1, wherein the first angle is less than 89.4 degrees.

3. The device according to claim 1, wherein the first angle is 80 degrees or more.

4. The device according to claim 1, wherein
the sixth partial region has a first surface and a second surface,
the first surface opposes the first semiconductor portion,
the second surface opposes the first semiconductor film part, and
a length of the at least a portion of the second surface when cut by a plane including the first direction and the second direction is not less than 50 nm and not more than 400 nm.

5. The device according to claim 1, wherein
the sixth partial region has a first surface and a second surface,
the first surface opposes the first semiconductor portion,
the second surface opposes the first semiconductor film part, and a thickness of the first semiconductor film part aligned with a direction perpendicular to the at least a portion of the second surface is not less than 3 nm and not more than 8 nm.

6. The device according to claim 1, wherein a distance between the first electrode and the third electrode is shorter than a distance between the third electrode and the second electrode.

7. The device according to claim 1, wherein
the third semiconductor region further includes a second semiconductor film part,
the second semiconductor film part is between the third electrode and the seventh partial region in the first direction,
the seventh partial region has a third surface and a fourth surface, the third surface opposing the second semiconductor portion, the fourth surface opposing the second semiconductor film part, and
a second angle between the third surface and at least a portion of the fourth surface is greater than 90 degrees.

8. The device according to claim 7, wherein an angle between a plane including the at least a portion of the second surface and a plane including the at least a portion of the fourth surface is 5 degrees or less.

9. The device according to claim 1, wherein a distance between the first electrode and the third electrode is longer than a distance between the third electrode and the second electrode.

10. The device according to claim 7, wherein
the third semiconductor region further includes a third semiconductor film part, and
the third semiconductor film part is between the third partial region and the third electrode.

11. The device according to claim 10, further comprising a first insulating member, the first insulating member including a first insulating portion, a second insulating portion, and a third insulating portion, wherein
the first insulating portion is between the sixth partial region and the third electrode,
the second insulating portion is between the third electrode and the seventh partial region,
the third insulating portion is between the third partial region and the third electrode.

12. The device according to claim 11, wherein
the first insulating member further includes a fourth insulating portion, the first semiconductor portion being between the sixth partial region and the fourth insulating portion,
the fourth insulating portion has a first insulating portion surface opposing the first semiconductor portion,
the first insulating portion has a second insulating portion surface opposing the first semiconductor film part, and
an insulating member surface angle between the first insulating portion surface and at least a portion of the second insulating portion surface is less than 90 degrees.

13. The device according to claim 12, wherein
the first insulating member further includes a fifth insulating portion, the second semiconductor portion being between the seventh partial region and the fifth insulating portion,
the fifth insulating portion has a third insulating portion surface opposing the second semiconductor portion,
the second insulating portion has a fourth insulating portion surface opposing the second semiconductor film part, and
a second insulating member surface angle between the third insulating portion surface and at least a portion of the fourth insulating portion surface is less than 90 degrees.

14. The device according to claim 12, wherein
the first insulating member further includes a fifth insulating portion, the second semiconductor portion being between the seventh partial region and the fifth insulating portion,
the fifth insulating portion has a third insulating portion surface opposing the second semiconductor portion,
the second insulating portion has a fourth insulating portion surface opposing the second semiconductor film part, and
a second insulating member surface angle between the third insulating portion surface and at least a portion of the fourth insulating portion surface is greater than 90 degrees.

15. The device according to claim 1, wherein x3 is higher than x2.

16. The device according to claim 1, wherein
the first insulating member further includes a fifth insulating portion, the second semiconductor portion being between the seventh partial region and the fifth insulating portion,
the fifth insulating portion has a third insulating portion surface opposing the second semiconductor portion,
the second insulating portion has a fourth insulating portion surface opposing the second semiconductor film part, and
a second insulating member surface angle between the third insulating portion surface and at least a portion of the fourth insulating portion surface is greater than 90 degrees.

17. The device according to claim 1, wherein
the sixth partial region has a first surface and a second surface,
the first surface opposes the first semiconductor portion,
the second surface opposes the first semiconductor film part, and
an angle between the first surface and at least a portion of the second surface is less than 90 degrees.

18. The device according to claim 17, wherein
the third electrode includes a first bottom face and a first side face,
the first bottom face faces the third partial region,
the first side face faces the first semiconductor film part, and
an angle between the first bottom face and the first side face being less than 90 degrees.

19. The device according to claim 17, wherein the first semiconductor film part directly contacts the sixth partial region.

* * * * *